United States Patent
Fukazawa et al.

(10) Patent No.: US 7,781,352 B2
(45) Date of Patent: Aug. 24, 2010

(54) METHOD FOR FORMING INORGANIC SILAZANE-BASED DIELECTRIC FILM

(75) Inventors: Atsuki Fukazawa, Tama (JP); Nobuo Matsuki, Tama (JP); Jeongseok Ha, Tama (JP)

(73) Assignee: ASM Japan K.K., Tokyo (JP)

( * ) Notice: Subject to any disclaimer, the term of this patent is extended or adjusted under 35 U.S.C. 154(b) by 194 days.

(21) Appl. No.: 11/759,159

(22) Filed: Jun. 6, 2007

(65) Prior Publication Data

US 2008/0305648 A1    Dec. 11, 2008

(51) Int. Cl.
*H01L 21/31* (2006.01)
*H01L 21/469* (2006.01)

(52) U.S. Cl. .................. 438/792; 438/789; 438/793; 257/E21.489; 257/E21.477; 257/E21.487

(58) Field of Classification Search ............... 438/792, 438/789, 793; 257/E21.489, E21.487, E21.477
See application file for complete search history.

(56) References Cited

U.S. PATENT DOCUMENTS

| | | | |
|---|---|---|---|
| 5,393,815 A | 2/1995 | Takeda et al. | |
| 5,487,920 A * | 1/1996 | Lopata et al. | 427/489 |
| 5,922,411 A | 7/1999 | Shimizu et al. | |
| 6,352,945 B1 | 3/2002 | Matsuki et al. | |
| 6,383,955 B1 | 5/2002 | Matsuki et al. | |
| 6,403,486 B1 | 6/2002 | Lou | |
| 6,410,463 B1 | 6/2002 | Matsuki | |
| 6,432,846 B1 | 8/2002 | Matsuki et al. | |
| 6,436,822 B1 | 8/2002 | Towle | |
| 6,455,445 B2 | 9/2002 | Matsuki | |
| 6,514,880 B2 | 2/2003 | Matsuki et al. | |
| 6,740,602 B1 | 5/2004 | Hendriks et al. | |
| 6,784,123 B2 | 8/2004 | Matsuki et al. | |
| 6,818,570 B2 | 11/2004 | Tsuji et al. | |
| 6,835,664 B1 | 12/2004 | Sarigiannis et al. | |
| 6,881,683 B2 | 4/2005 | Matsuki et al. | |
| 6,890,869 B2 | 5/2005 | Chung | |
| 7,064,088 B2 | 6/2006 | Hyodo et al. | |
| 7,354,873 B2 | 4/2008 | Fukazawa et al. | |
| 2001/0055889 A1 * | 12/2001 | Iyer | 438/758 |
| 2003/0100175 A1 | 5/2003 | Nobutoki et al. | |

(Continued)

FOREIGN PATENT DOCUMENTS

EP       1 225 194 A2     7/2002

(Continued)

OTHER PUBLICATIONS

Martin T. K. Soh, et al "Local bonding environment of plasma deposited nitrogen rich silicon nitride films" Journal of Applied Physics vol. 97, pp. 093714-1-8(2005).*

(Continued)

*Primary Examiner*—Caridad M Everhart
(74) *Attorney, Agent, or Firm*—Knobbe Martens Olson & Bear LLP (57) ABSTRACT

A method of forming an inorganic silazane-based dielectric film includes: introducing a gas constituted by Si and H and a gas constituted by N and optionally H into a reaction chamber where an object is placed; controlling a temperature of the object at −50° C. to 50° C.; and depositing by plasma reaction a film constituted by Si, N, and H containing inorganic silazane bonds.

14 Claims, 4 Drawing Sheets

U.S. PATENT DOCUMENTS

| | | |
|---|---|---|
| 2003/0194880 A1 | 10/2003 | Singh et al. |
| 2004/0137757 A1 | 7/2004 | Li et al. |
| 2005/0129932 A1 | 6/2005 | Briley |
| 2006/0014399 A1* | 1/2006 | Joe ........................... 438/791 |
| 2006/0110931 A1 | 5/2006 | Fukazawa et al. |
| 2006/0228866 A1 | 10/2006 | Ryan et al. |
| 2006/0240652 A1* | 10/2006 | Mandal ..................... 438/562 |
| 2006/0258176 A1 | 11/2006 | Fukazawa et al. |
| 2007/0004204 A1 | 1/2007 | Fukazawa et al. |
| 2007/0065597 A1 | 3/2007 | Kaido et al. |
| 2007/0289534 A1* | 12/2007 | Lubomirsky et al. .... 118/723 R |
| 2008/0076266 A1 | 3/2008 | Fukazawa et al. |
| 2008/0305648 A1 | 12/2008 | Fukazawa et al. |

FOREIGN PATENT DOCUMENTS

JP    2006-054353    2/2006

OTHER PUBLICATIONS

Sanghoon Bae et al "Characteristics of low temperature silicion nitride using electron cyclotron resonance plasma" Solid State Electronics, vol. 44, pp. 1355-1360 (2000).*

Tonya M. Klien et al Hydrogenated silicon nitride thin films depoisted between 50 and 250 degrees C, J. Vac. Sci. Technol. A, vol. 17, No. 1, pp. 108-112 (1999).*

A. J. Kalkman et al., $SiOF_X$ and $SiO_2$ deposition in an ECR-HDP reactor: Tool characterization and film analysis, Microelectronic Engineering 37-38(1999) 271-276.

W. J. Lee et al., Device Isolation Technology on Semiconductor Substrate, U.S. Appl. No. 12/130,522, filed May 30, 2008.

* cited by examiner

METHOD FOR FORMING INORGANIC SILAZANE-BASED DIELECTRIC FILM

BACKGROUND OF THE INVENTION

1. Field of the Invention

The present invention relates generally to a semiconductor technique and more particularly to a silicone-containing dielectric film having good filling or padding property for an interconnect structure of a semiconductor substrate.

2. Description of the Related Art

In the plasma chemical vapor deposition method (plasma CVD method), deposition of a film on semiconductor substrates is conducted by placing each semiconductor substrate, being a processing target, on a resistance-heating type heater preheated to 0 to 350° C. in an atmosphere of 1 to 10 Torr. This heater is placed in a manner facing a shower plate that releases reactant gas, and high-frequency power of 13.56 MHz to 60 MHz, etc., is applied by 100 to 4,000 W to the shower plate to cause high-frequency discharge between the heater and shower plate and thereby generate plasma. The plasma CVD method is used to deposit various types of thin film, such as an interconnect insulation film, passivation film, and anti-reflection film. Since achieving a disproportionately high level of surface diffusion is difficult with parallel-plate type plasma CVD, high-density plasma CVD that uses microwaves has traditionally been used to form an oxide film, etc., having filling characteristics. These techniques have been used since the days of 250-nm device nodes. One feature of such apparatus is that it not only forms a film, but also performs etching of a film, which means that the apparatus can support smaller hole diameters. With current products having device nodes of 65 nm to 90 nm, the mainstream processing method is one that combines film formation and etch-back. Representative processes in which this method is used include STI (Shallow Trench Isolation), and upper-layer processing in the wiring process.

However, combination of film formation and etch-back will not likely support smaller device nodes of 60 nm and below, and there is a need for an insulation film offering sufficient filling characteristics in line with the accelerating trend for super-fine circuitry.

Methods are known whereby a reactant having fluidity is formed on a silicon substrate using a low-temperature susceptor (such as a liquid-layer forming technology called the flow-fill process or flowable process). Many of these methods use siloxane reaction and mixing of $SiH_4$ with $O_3$ or other substance offering strong oxidizing power. However, an oxide film embedded by any such method presents the problems of the film becoming sparse in the embedded area and peeling off or breaking due to change in stress. One key reason that explains these problems is the production of water by the hydrogen groups and oxygen groups contained in the material, which can significantly increase the contraction coefficient of the annealed film. Also, water production in the film forming process creates voids when water is subsequently removed in the annealing of the formed film, which also increase the tendency of the film becoming sparse.

If the reactant gas contains oxygen and hydrogen, water is produced as a result of plasma reaction. The generated water and oligomer containing Si attach to the wafer surface that has been cooled. The attached liquid having fluidity flows into fine trench structures and holes in an early stage of the film forming process due to the effect of surface tension, and therefore a product having higher water content and higher fluidity generates and accumulates at the bottom of fine structures. Since any material of high water content become less dense when annealed, the aforementioned phenomenon leads to a lower film density at the bottom of fine structures.

SUMMARY OF THE INVENTION

As a process to enable embedding of a film into finer structures, an embodiment of the present invention forms fluid silazane containing no water on a silicon substrate based on a material such as $SiH_4$ or $Si_2H_6$ and a nitrogen additive such as $NH_3$ or $N_2$. In an embodiment of the present invention, the susceptor temperature is controlled to a range of −50 to 50° C., and a material such as $SiH_4$ or $Si_2H_6$ and a nitrogen additive such as $NH_3$ or $N_2$ are added to form silazane on a silicon substrate by means of plasma CVD. The low susceptor temperature ensures fluidity, and the surface tension enables embedding of a film in patterns having trenches and holes. Also, the reactant gas does not contain oxygen, which means that the generated product does not contain water.

In an embodiment of the present invention, UV irradiation or hot annealing is performed in an oxidizing gas atmosphere to allow a dense oxide film of low film contraction coefficient to be formed. In the aforementioned embodiment, the nitrogen groups are substituted by oxygen groups during annealing to form an oxide film. Since the achieved film does not contain water, its density and quality do not drop.

In an embodiment of the present invention, silazane is dissolved by adding CxHy to add fluidity, which enables embedding of a film regardless of the wiring width. In an embodiment of the present invention, a formed film is UV-cured or heat-treated at 450° C. or above in an oxidizing gas atmosphere to substitute the nitrogen groups in the film with oxygen groups and therefore achieve a dense oxide film. The only substance discharged during heat treatment is the remnant of CxHy that had served as a catalyst in the dissolution of silazane, and accordingly the achieved film has a different contraction coefficient than any liquid material constituted by Si—O and hydrocarbons. As a result, in an embodiment of the present invention the film contraction coefficient is improved significantly to as low as approx. 10% from approx. 30% achieved by conventional methods. The method for forming an oxide film according to the aforementioned embodiment can be effectively applied to any embedded oxide film such as a STI (Shallow Trench Isolation) or PMD (Premetal Dielectric) film.

There are two methods that provide a function equivalent to the formation of a silazane film using SixHy and NxHy, including a method to form a silazane film offering fluidity by combining SiaNbCdHe (where a, b, d and e are arbitrary integers), and a method to form a silazane film using SiaNbCdHe (where a, b, d and e are arbitrary integers) and then add fluidity by dissolving the formed film in a hydrocarbon gas. Both methods can achieve results equivalent to what can be attained by the aforementioned approach of forming a silazane film using SixHy and NxHy and adding fluidity using a hydrocarbon gas. For your information, these methods can provide a pure oxide film once heat treatment is applied.

For purposes of summarizing the invention and the advantages achieved over the prior art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

DETAILED DESCRIPTION OF THE PREFERRED EMBODIMENT

As mentioned above, the present invention encompasses various embodiments. In an embodiment, the present invention provides a method of forming a dielectric film, comprising the steps of: (i) introducing a gas constituted by Si and H and a gas constituted by N and optionally H into a reaction chamber where an object is placed; (ii) controlling a temperature of the object at −50° C. to 50° C.; and (iii) depositing by plasma reaction an inorganic silazane-based film constituted by Si, N, and H containing inorganic silazane bonds. The film may be a polysilazane film. The film can be used as a precursor film for an oxide insulation film in an interconnect structure, as a precursor film for a silicon nitride film, or as a precoat film for covering a surface of a susceptor or other surfaces inside the reactor.

The above embodiments further include, but are not limited to, the following embodiments:

In an embodiment, the gas constituted by Si and H may be SiH4 or Si2H6. In an embodiment, the gas constituted by N and optionally H may be NH3 or N2 or a combination of the foregoing. In an embodiment, in the gas introducing step, no oxygen-supplying gas may be introduced into the reaction chamber. In an embodiment, the gas introducing step may further comprise introducing an inert gas into the reaction chamber.

In an embodiment, the method may further comprise introducing into the reaction chamber an additive gas constituted by C, H, and optionally O continuously before, simultaneously with, or continuously after the deposition of the inorganic silazane-based film on the object. By adding the additive gas, the fluidity or viscosity of the inorganic silazane-based material can be reduced, thereby improving filling or padding property of the material. In an embodiment, the additive gas may be hexane.

In an embodiment, the object may be a semiconductor substrate placed on a susceptor disposed in the reaction chamber. In an embodiment, the substrate may have an irregular surface including a concave portion. In an embodiment, the concave portion of the irregular surface may have holes or grooves, and the deposition step may be performed on the irregular surface to fill the holes or grooves with the inorganic silazane-based film.

In an embodiment, the method may further comprise heat-treating the substrate with the inorganic silazane-based film in a heat-treating chamber while introducing an oxygen-supplying gas into the heat-treating chamber to replace N with O in the film, thereby converting the film to an oxide film. In an embodiment, the oxygen-supplying gas may be O2, CO2, and/or N2O.

In an embodiment, the method may further comprise heat-treating the substrate with the inorganic silazane-based film in a heat-treating chamber without introducing an oxygen-supplying gas into the heat-treating chamber, thereby forming a silicone nitride film from the film.

In an embodiment, the heat-treatment step may be performed by UV curing at a temperature of lower than 450° C. In an embodiment, the heat-treatment step may be performed by thermal annealing at a temperature of 450° C. or higher.

In an embodiment, the gas introducing step may comprise controlling a flow ratio of the gas constituted by Si and H to the gas constituted by N and optionally H at 2 or higher.

In an embodiment, the present invention provides a method for forming an interconnect structure, comprising the steps of: (i) forming a three-dimensional structure for interconnect in a substrate; and (ii) forming an insulation layer on a surface of the three-dimensional structure using any method of the foregoing.

In the above, in an embodiment, the method may further comprise wet-etching the insulation film. In an embodiment, the step of forming a three-dimensional structure may comprise forming a layer of aluminum, tungsten, or tungsten silicon as a wiring layer and etching the layer in a pattern.

The following lists one example of a set of film forming conditions (bulk-film forming conditions) used in an embodiment of the present invention. These conditions can be used in any combination, and the present invention is not at all limited to these conditions:

1) Film forming temperature (susceptor temperature): −50 to 50° C., or preferably −10 to 5° C.
2) Material: $SiH_4$ and/or $Si_2H_6$.
3) Material flow rate: 1 to 350 sccm, or preferably 5 to 100 sccm.
4) Additive gas: $NH_3$ and/or $N_2$ (Nitrogen additive gases are used, and gases containing oxygen atoms are not used because they produce water in the film forming process.).
5) Additive gas flow rate: 10 to 700 sccm, or preferably 50 to 300 sccm.
6) Carrier gas: He, Ar, Kr and/or Xe.
7) Carrier gas flow rate: 100 to 2,000 sccm, or preferably 200 to 1,000 sccm.
8) Pressure: 133 to 800 Pa, or preferably 133 to 533 Pa.
9) RF power: 50 to 2,500 W, or preferably 100 to 600 W.
10) RF frequency: 13.56 to 60 MHz, or preferably 13.56 to 27.12 MHz.

A relatively low RF power may be effective in controlling the low deposition rate. In an embodiment, low-frequency RF power may be 1%-50% of the high-frequency RF power (including 5%, 10%, 15%, 20%, 30%, 40%, and values between any two numbers of the foregoing). The low-frequency RF power may have a frequency of 2 MHz or less (e.g., 400 kHz, 430 kHz).

11) Discharge gap: 10 to 30 mm, or preferably 16 to 26 mm.

The following lists one example of a set of heat treatment conditions used in an embodiment of the present invention.

These conditions can be used in any combination, and the present invention is not at all limited to these conditions:

12) Heat treatment temperature: 200 to 1,000° C., or preferably 800 to 900° C.

13) Means for heat treatment: UV treatment (refer to FIG. 2) when the heat treatment temperature is below 450° C., or hot annealing (refer to FIG. 4) when the heat treatment temperature is 450° C. or above. Basically, the heat treatment temperature is set according to the specific application. The STI process requires a high-density film and also permits heat treatment at high temperatures because it is a substrate process, while low treatment temperatures are used in processes performed above the gate or in certain other applications such as those where the achieved film is used as a sacrificial film.

14) Treatment time: 30 to 120 min, or preferably 60 to 90 min. Although the specific treatment time varies depending on the flow rate ratio of $SiH_4$ and $NH_3$, which is an important parameter in forming a film, an appropriate temperature is determined by considering the heat history of the device, among others. In an embodiment of the present invention, the treatment temperature is approx. 1 hour to 1 hour and 30 minutes when temperature is in a range of 800 to 950° C., although the specific temperature may vary depending on the device structure.

15) Other gases to be introduced: $O_2$, $O_3$, $CO_2$ or $N_2O$ if oxidization is to be implemented. The heat treatment method is changed according to the type of the final film to be achieved. Basically, the bulk film is a silazane film not containing oxygen groups, and an oxide film will be formed if Si—N is converted to Si—O by means of subsequent oxidizing heat treatment. On the other hand, a silicon nitride film will be formed if the silazane film is heat-treated using an inert gas (such as any of the gases specified in 6) above) without oxidizing the film.

16) Introduced gas flow rate: 200 to 2,000 sccm, or preferably 1,000 to 1,500 sccm.

17) Pressure: 133 to 800 Pa, or preferably 399 to 733 Pa.

The following lists one example of a set of film characteristics achieved in an embodiment of the present invention. These characteristics may manifest in any combination, and the present invention is not at all limited to these characteristics:

18) Film contraction coefficient: Less than 20%, or preferably 15% or less, or more preferably 10% or less, if an oxide film is formed. During heat treatment, an O group enters the film the moment an N group is removed from the film to form a SiO bond. Since this reduces the substance removed from the film, the film contraction coefficient becomes low, or specifically the coefficient drops to a range of 5 to 10% in an embodiment of the present invention.

19) Dielectric constant: 3.85 to 4.1, or preferably 3.9 to 4.

20) Leak current: A −9th power level, or preferably a −10th power level, or more preferably −10th power of 2 or less, at 2 MV.

21) RI: 1.45 to 1.53, or preferably 1.46 to 1.5.

22) Film density: 2.0 to 2.3 $g/cm^3$, or preferably 2.1 to 2.2 $g/cm^3$.

23) Etch rate (blanket): 30 to 90 nm/min, or preferably 30 to 50 nm/min. Etch rate (pattern): Within 3 times the blanket etch rate, or preferably within twice the blanket etch rate.

In an embodiment of the present invention, it has been confirmed that a dense film having a film density of 2.1 $g/cm^3$ after annealing can be formed over an uneven pattern in a STI structure of 30 to 100 nm in wiring width by using a film forming parameter of twice or more (such as three times or more, four times or more, or 10 times or less) being the ratio of the flow rate of the material (Si feed gas) to the flow rate of the nitrogen additive (N feed gas). Since the contraction coefficient is nearly zero after annealing and therefore the film does not contract by 20 to 30% as is the case in processes using siloxane reaction, etc. problems such as broken film or peeling from the base do not occur. In other embodiment of the present invention, desirably the material flow rate should be higher than the nitrogen additive flow rate. However, in some situations the nitrogen additive flow rate is made higher than the material flow rate, in which case the ratio can be adjusted within a range of 1:10 to 10:1.

As for the parameters used in the forming of a SiNxHy bulk film, in an embodiment of the present invention the flow rates of $SiH_4$ and $NH_3$ have the greatest impact, while the Si content also has significant bearing, as explained above. Basically, although the change from Si—N to Si—O occurs as a result of heat treatment at high temperature, formation of a different oxide film has been confirmed by FT-IR waveforms. Particularly when the $SiH_4$ flow rate is high, the Si content in the film is high and the film density tends to increase. In an embodiment of the present invention, the flow rate ratio of Si feed gas to N feed gas is in a range of 2:1 to 5:1. If the $NH_3$ flow rate is higher, on the other hand, the film density becomes low and N may still remain, although by a small amount, even after the film is heat-treated at high temperature. Based on the above, it is possible to meet the required film characteristics in the formation of a bulk film by giving consideration to the aforementioned factors. When forming a silazane bulk film, it is preferable that the $SiH_4$ flow rate be set higher than the $NH_3$ flow rate in view of the FT-IR waveforms and RI results. The most compelling reason for this is that the peaks showing the Si—O structure are slimier to the waveforms of existing Si—O films. A SiO composition is also achieved even when the $NH_3$ flow rate is higher.

When siloxane reaction is implemented alone, the film tends to become sparse due to removal in the annealing process of the water produced in the film when it is formed over an uneven pattern. With an uneven pattern, a weak film formed immediately after the plasma oscillation enters the structure by means of surface tension. If the wiring width decreases, the percentage of the portion of this initial film entering the uneven pattern increases because of the relationship between wiring width and surface tension, and consequently the film becomes even weaker. Therefore, any method using siloxane is associated with a high film contraction coefficient and often presents problems such as broken film and peeling. However, these phenomena occur only with a film formed at the bottom of concaved parts in an uneven pattern, and a dense film is formed at the top of projected parts and in areas above one-half the depth of the embedded film. All in all, however, siloxane reaction is not suitable in the formation of an embedded film as far as the condition of initial film is considered.

For example, adopting a laminated structure of silazane and siloxane provides a film thickness ratio of 2 to 8 (silazane layer) to 1 to 4 (siloxane layer), although the specific ratio varies depending on the depth of the STI structure in which the film is embedded (for example, refer to U.S. Publication No. 2006-0228866, U.S. Pat. No. 6,403,486, and U.S. Pat. No. 6,835,664, the disclosure of which is incorporated herein by reference in their entirety). In an embodiment of the present invention, a siloxane layer can be formed by, for example, using any of the methods described in U.S. Pat. Nos. 6,455,445, 6,818,570 and 6,740,602, U.S. patent application Ser. No. 11/465,571 owned by the same assignee, and the like (the disclosure of which is incorporated herein by reference in their entirety).

Based on the above, it is essential that $H_2O$ be not produced when a film is formed. In an embodiment of the present invention, SiNxHy is formed using $SiH_4$ and $NH_3$ to prevent $H_2O$ from being produced when a film is formed. In an embodiment of the present invention, a CxHy gas is added to dissolve SiNxHy and thereby add fluidity before, after or during the film formation process, because SiNxHy itself has no fluidity. It is also possible to protect the outer periphery of the wafer with an anti-deposition mask using a method similar to any of the methods described in U.S. patent application Ser. Nos. 11/227,525 and 11/228,152 owned by the same assignee, and the like (the disclosure of which is incorporated herein by reference in their entirety), in order to prevent deposition around the outer periphery of the wafer when a liquid layer is formed.

If adding fluidity after formation of silazane is essential and important, such fluidity can be ensured, for example, by any of the methods specified below:

1) Form a liquid layer using CxHy before forming silazane. Then, form a silazane layer on top of the liquid layer to dissolve silazane. In an embodiment of the present invention, the standard condition is where a CxHy liquid layer of approx. 100 nm is deposited on the silicon substrate with respect to a silazane bulk film of 500 nm.

2) Add a CxHy gas as an additive when silazane is formed, in order to dissolve silazane while a film is being formed. The CxHy gas flow rate is approx. 10 to 1,000 sccm, or preferably approx. 100 to 300 sccm. In an embodiment of the present invention, an inert gas (the same gas used when the silazane film is formed) is supplied by approx. 100 to 2,000 sccm, or preferably by approx. 200 to 1,000 sccm. Other conditions can be set as deemed appropriate according to the conditions for forming the silazane film.

3) Add a CxHy gas after silazane has been formed to dissolve the formed silazane. In an embodiment of the present invention, the flow rate conforms to the ranges specified in 2 above. Although a portion of the CxHy gas is likely dissolved, a majority of the gas functions as a catalyst and therefore ultimately discharged as a result of heat treatment.

The CxHy gas may be hexane, mesitylene, xylene, etc. Regardless of which of these gases is used, the CxHy gas may still remain as carbon in the film immediately after it has been formed. However, this carbon in the film is discharged when the film is subsequently heat-treated at high temperature. It is difficult to ensure sufficient fluidity of silazane even when the susceptor temperature is lowered to a range of −10 to 0° C., and therefore dissolving silazane using CxHy is effective. This method has been confirmed to achieve a film offering good embedding property in holes and STI structures of 50 nm or smaller. The same can be said to PMD structures, where a film can be embedded in widths of approx. 50 nm. In an embodiment of the present invention, heat treatment needs to be provided after the film has been dissolved, in order to substitute the CxHy solvent and Si—N in the film by Si—O. In an embodiment of the present invention, heat treatment is implemented at a susceptor temperature of 200 to 400° C., for example, for the purpose of removing the CxHy solvent and suppressing water absorption. Thereafter, another round of heat treatment is implemented at 800 to 950° C. to achieve a complete $SiO_2$ film.

In addition to the methods for forming a silazane bulk film using SixHy with $NH_3$ or $N_2$, it is also possible to add fluidity by combining a liquid material of SiaNbCdHe (where a, b, c and d are arbitrary integers) with CxHy and CxHyOz. Another possible way is to form a silazane film using SiaNbCdHe (where a, b, c and d are arbitrary integers), and then add fluidity with CxHy and CxHyOz before embedding the film. In this case, a pure oxide film can be achieved after heat treatment.

When FT-IR is used to examine how the film composition changes after heat treatment is given in an atmosphere, it is found that nitrogen groups remain in the film and that the film is not a complete oxide film. When heat treatment is provided using a nitrogen gas, a silicon nitride film is formed. To obtain an oxide film, an oxidizing gas needs to be introduced during annealing, and in fact FT-IP peaks indicating a favorable oxide film composition can be achieved when heat treatment is given at the same temperature while introducing oxygen, etc. It has also been confirmed that the change of Si—N to Si—O also occurs under $O_2$ curing using UV light of 172 to 260 nm in wavelength. Based on FT-IR peaks, the peak intensity and wavelength vary even when a same SiO film is formed. This is due to the different conditions used for forming a silazane bulk film. In an embodiment of the present invention, Si—H bonds are also present in the film and therefore FT-IR waveforms taken after the heat treatment show reduced or incomplete levels of peak intensity. Based on the above, it can be said that, in an embodiment of the present invention, Si—H is substituted by Si—O by means of an oxidization action that occurs during UV curing. Generation of Si—H is linked to the $SiH_4$ flow rate.

The CxHy hydrocarbon gas, which is used for dissolving silazane, is also removed from the film during the same heat treatment process. The above explains a lower film contraction coefficient, which is still approx. 10% before and after the heat treatment, but is a great improvement compared to 20 to 30% attained with a conventional material based on a Si—O structure. Reasons for this improved film contraction coefficient include presence of the CxHy solvent as the only outgassing component and substitution of Si—N with Si—O.

In an embodiment of the present invention, the achieved silazane film can also be used as a precoat film. When a precoat film is formed in a normal process at 0° C., a liquid layer is formed, instead of a film, over the lower electrode that constitutes the susceptor and therefore forming a practical precoat film becomes very difficult. In an embodiment of the present invention, the achieved silazane film is not a liquid layer, but a bulk film, and it thus functions as a precoat film capable of protecting the electrodes from metal contamination that occurs at the upper and lower electrodes inside the reactor. Also, the formed precoat film is etched off by plasma cleaning of the reactor after the film has been formed. A silazane precoat film has strength and stability equivalent to the levels exhibited by a film formed by a process in which the susceptor is heated, and accordingly no problem is anticipated in the practical use of this silazane precoat film. In addition, such silazane precoat film also provides a significant advantage in that it can also be used as a precoat film for all types of low-temperature film forming chambers.

For your information, in an embodiment of the present invention the conditions for forming a precoat film are similar to those used for forming a film on a substrate. One feature of such embodiment is that a bulk layer, not a liquid layer, is formed on a susceptor even when the susceptor is controlled at a low temperature during the film formation process, and therefore a film having no fluidity and offering good mechanical strength can be formed. In this sense, it is not necessary to heat the susceptor surface after a precoat film is deposited on the susceptor controlled at a low temperature. In an embodiment of the present invention, fluidity is added to a silazane film by means of CxHy treatment given after the film has been formed, or by adding CxHy during the film forming process (embodiments explained in 2) and 3) above).

Also, although a silazane film can be applied to STI and PMD processes (for example, refer to U.S. Patent Publication No. 2005-129932), these processes are subject to high metal contamination because they are a part of a substrate process. In addition, the metal contamination standards also increase as the patterns become finer. In view of these points, a concurrent use of a silazane-based precoat film presents significant benefits. Another way to prevent metal contamination is to constitute the upper and lower electrodes, which are essential components of plasma discharge, by non-metal materials. However, some Al from AlN is detected in certain conditions, in which case a concurrent use of a precoat film makes it possible to suppress metal contamination as well as particle attachment at the back of the silicon substrate. Also, basically cleaning the reactor becomes more difficult as the carbon content increases. CxFy, $NF_3$ and other materials normally used in CVD are added mainly for the purpose of removing silicon, and thus they are inefficient in removing carbon. Generally, $O_2$ is used to remove carbon films. In reality, however, it takes time to remove both Si and carbon. To address this problem, a precoat film can be formed over the inner walls of the reactor and carbon is allowed to deposit on top of the precoat film, so that when the precoat film is etched off, the carbon film deposited on top of the precoat film is also removed. This method increases the efficiency of carbon cleaning. To be specific, it is possible to form a precoat film by introducing the CxHy gas used in dissolving the silazane bulk film, in order to prevent carbon from depositing directly on the inner walls of the reactor. In this case, the precoat film covering the inner walls of the reactor can be removed easily by means of plasma cleaning.

In one embodiment of the present invention, insulating substance (the inorganic silazane-based film with CxHy gas) having fluidity is caused to fill irregular patterns by means of surface tension. To cause insulating substance to fill an irregular pattern, a film is formed on the substrate surface. At this time, a film formed on a blanket has different quality than the film formed in an irregular pattern. In one embodiment, the growth speed of film formed in an irregular pattern is around twice to four times the growth speed of blanket film. For this reason, the film formed inside an irregular pattern tends to become sparse, and after heat is applied holes called "pores" form around the sparse regions of the film. In one embodiment, film growth speed has significant bearing on film density, and controlling the growth speed of blanket film to 100 nm or below will prevent the oxide film in an irregular pattern from becoming sparsely formed.

According to an embodiment, in any of the foregoing method, the concave portion of the irregular surface may have holes or grooves, and the deposition step is performed on the irregular surface to fill the holes or grooves with the insulation film. In an embodiment, the irregular surface may have a three-dimensional structure of SiN, SiO, Poly-Si, Cu, or Si•barrier metal, or in another embodiment, aluminum, tungsten, or tungsten silicon. According to an embodiment, in any of the foregoing method, the irregular surface with the concave portion may be a patterned surface for wiring. Further, in an embodiment, the concave portion of the irregular surface of the substrate may have an aspect ratio of about 1/3 to about 1/10. For a high aspect ratio such as 1/3 to 1/10 (e.g., a Shallow Trench Isolation (STI) structure formed in a Si substrate) or a wiring pitch of 100 nm or less (e.g., 45 nm to 100 nm for an Al/low-k structure), the inorganic silazane-based film with CxHy gas can fill in the holes or grooves without creating voids.

In an embodiment, formation of an oxide film is followed by processes where a film is subsequently formed or processed. Since these processes include washing, etc., wet etching resistance becomes important. From this viewpoint, in an embodiment, the precursor is given certain characteristics to improve wet-etch rate. Based on evaluation results, in an embodiment, an oxide film derived from the inorganic silazane-based film shows a wet-etch rate of 35 to 55 nm/min, which is comparable to the wet-etch rate of 40 nm/min with a thermal oxide film. Wet-etch rate can be evaluated using LAL500 by Stella Chemifa, which is a buffered hydrofluoric acid containing surface active agent.

In an embodiment of the present invention, an insulation film may be formed on a low-k film or on a Cu layer or formed on a surface of a via and/or trench in a damascene process as a barrier film, or on a three-dimensional structure of Al, tungsten, or tungsten silicon (or any other wiring materials) which can be processed by dry-etching. In the case where the insulation film and the low-k film can continuously be formed using the same equipment, particle contamination problems can be eliminated and productivity can increase.

The substrate may have an irregular surface which is a patterned surface for wiring comprised of a concave portion wherein the insulation film is to be filled. The substrate may have an exposed Cu layer on which the insulation film is to be formed.

In all of the aforesaid embodiments and aspects, any element used in an embodiment or aspect can interchangeably or additionally be used in another embodiment or aspect unless such a replacement is not feasible or causes adverse effect.

Further aspects, features and advantages will become apparent from the detailed description of the preferred examples which follows. The preferred embodiments are not intended to limit the present invention.

Figure 1:
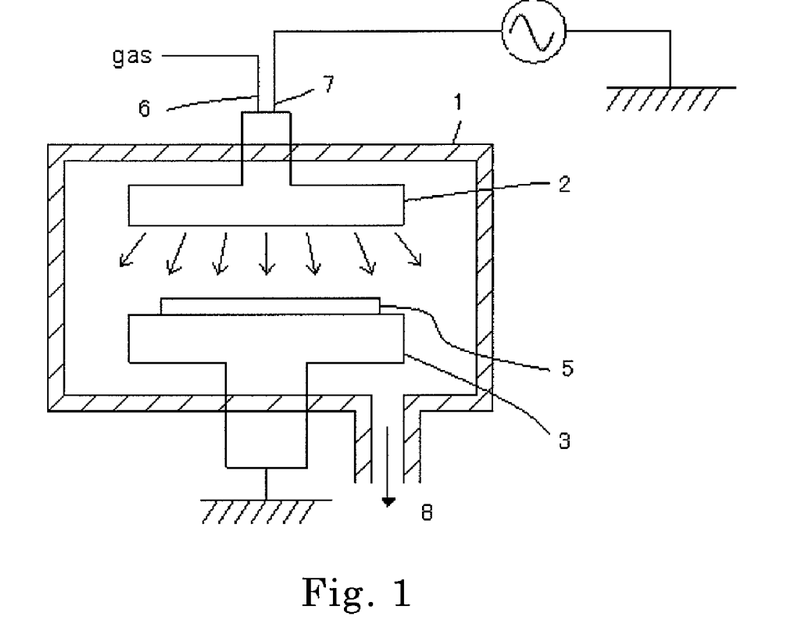
FIG. 1 is a schematic diagram illustrating a plasma CVD apparatus usable forming an inorganic silazane-based film in an embodiment of the present invention.

FIG. 1 diagrammatically shows a plasma CVD apparatus usable in an embodiment of this invention. The plasma CVD device includes a reaction chamber 1, a gas inlet port 6, a susceptor 3 (serving as a lower electrode) provided with an embedded temperature controller which can be a coil in which a coolant or heating medium flows in a channel to control the temperature. A showerhead 2 (serving as an upper electrode) may be disposed immediately under the gas inlet port. The showerhead 2 has a number of fine openings at its bottom face and can inject reaction gas to the semiconductor substrate 5 therefrom. There is an exhaust port 8 at the bottom of the reaction chamber 1. This exhaust port 8 is connected to an outer vacuum pump (not shown) so that the inside of the reaction chamber 1 can be evacuated. The susceptor 3 is placed in parallel with and facing the showerhead 2. The susceptor 3 holds a semiconductor substrate 5 thereon and heats or cools it with the temperature controller. The gas inlet port 6 is insulated from the reaction chamber 1 and connected to an outer high frequency power supply 4. Alternatively, the susceptor 3 can be connected to the power supply 4. Thus, the showerhead 2 and the susceptor 3 act as a high frequency electrode and generate a plasma reacting field in proximity to the surface of the semiconductor substrate 5.

The gases can be mixed upstream of the gas inlet port 6 to constitute a process gas, or each or some of the gases can be introduced separately into the showerhead 2. The space between the showerhead 2 and the semiconductor substrate 5, both located inside of the reaction chamber 1 which is already evacuated, is charged with RF power which has a single frequency or mixed frequencies (e.g., 13.56 MHz to 60 MHz), and the space serves as a plasma field. The susceptor 3 continuously heats or cools the semiconductor substrate 5 with the temperature controller and maintains the substrate 5 at a predetermined temperature that is desirably −50° C.-50° C. The process gas supplied through the fine openings of the showerhead 2 remains in the plasma field in proximity to the surface of the semiconductor substrate 5 for a predetermined time.

When the insulation film is deposited on the substrate, the gas inside the reaction chamber is discharged through the exhaust port 8 and replaced with a reduction gas or a mixture of a reduction gas and an inert gas, while maintaining the substrate in the reaction chamber.

Figure 3:
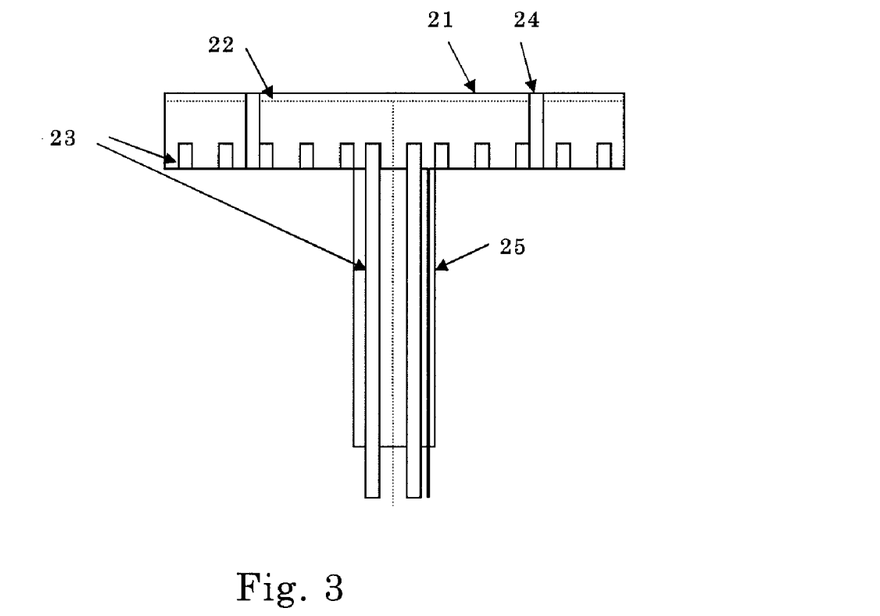
FIG. 3 is a schematic diagram showing a cooling susceptor provided in a plasma CVD apparatus usable in an embodiment of the present invention.

The temperature of the susceptor 3 can be controlled by means of a heater (not shown) and cooling conduits 23 as shown in FIG. 3. This cooling susceptor is made of ceramics and is provided with the cooling conduits 23 at a lower portion of a metal plate for RF 22 and a shaft portion so that a cooling medium such as water can circulate. The temperature is measured by a thermal coupler 25 provided at a lower portion of the metal late 22. The metal plate has holes 24 for wafer lift pins and a wafer supporting portion is formed on the metal plate 22.

Figure 2:
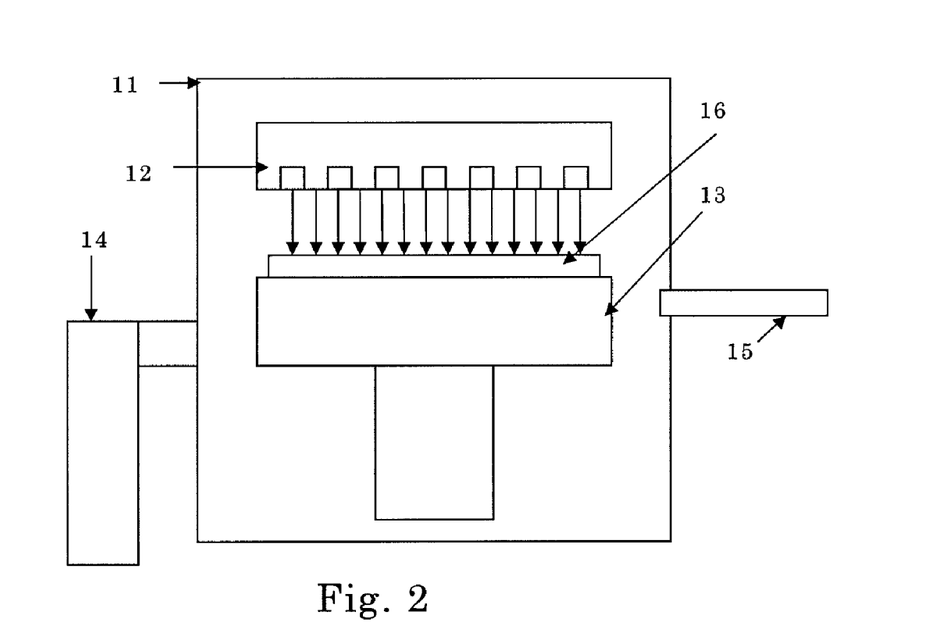
FIG. 2 is a schematic diagram showing a UV curing apparatus usable in an embodiment of the present invention.

In an embodiment, subsequently, a curing process is performed on the semiconductor substrate taken out from the reactor using the UV cure apparatus shown in FIG. 2. The UV cure apparatus comprises a process chamber 11, a UV lamp 12, a susceptor 13, an exhaust port 14, and a gas inlet port 15. The UV lamp and a susceptor 13 are disposed parallel, and are heated by heaters embedded in them respectively. The semiconductor substrate 16, which is a workpiece, is placed on the susceptor 13 and is heated and held. Projected from the UV lamp whose wavelength range is selected from 172-250 nm, light is irradiated toward the semiconductor substrate 16. When the semiconductor substrate is irradiated, gases such as He, $H_2$, $N_2$, $O_2$, $CO_2$, etc. (depending on the intended type of film) are being introduced through the gas inlet port 15. As soon as pores are formed in the film with H, O, C, etc. being desorbed from a low-dielectric-constant structure, unstable bonds no longer exist; hence, a film having a lower dielectric constant and higher strength can be obtained.

As the UV cure apparatus, the apparatus disclosed in commonly assigned U.S. patent application Ser. No. 11/040,863 can be used, the disclosure of which is incorporated herein by reference in its entirety.

Figure 4:
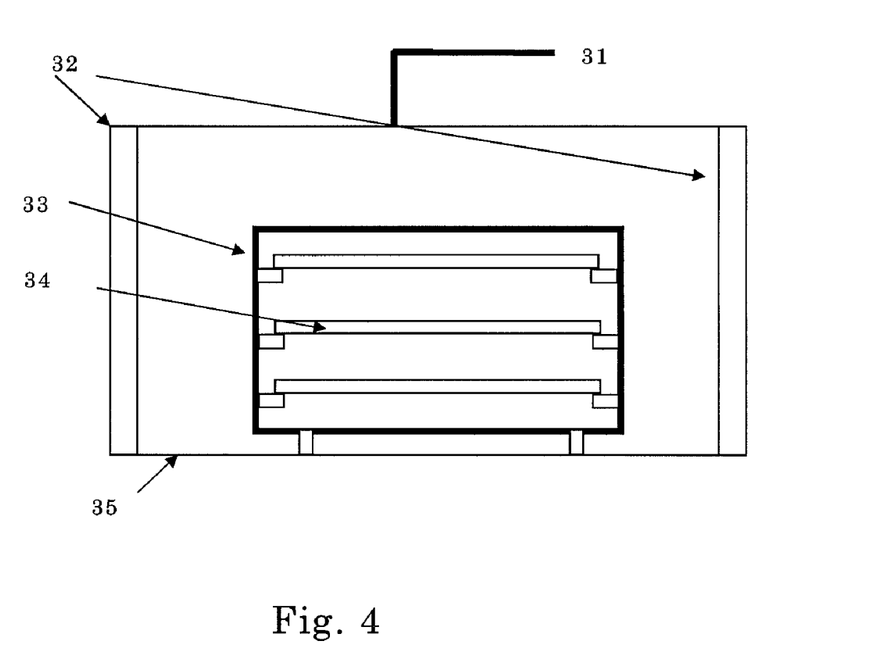
FIG. 4 is a schematic diagram showing a thermal annealing apparatus usable in an embodiment of the present invention.

The heat-treating step can be performed by thermal annealing in place of the UV curing. FIG. 4 shows a schematic diagram of a thermal annealing apparatus. In a chamber 35, a quartz boat 33 is provided, and a substrate 34 is placed inside the quartz boat 33. The temperature inside the quartz boat 33 is controlled by a heater 32, and gases can be introduced inside through a gas inlet port 31.

In an embodiment of the present invention, a material such as $SiH_4$ or $Si_2H_6$ and a nitrogen additive such as $NH_3$ or $N_2$ are caused to undergo a decomposition reaction by means of plasma on a silicon substrate retained on a susceptor cooled to a temperature of −50 to 50° C. At this time, the film is constituted by only Si, N and H. Thereafter, annealing is performed in an oxidizing gas atmosphere. In consideration of the effect of heat, a method that uses UV curing is selected if the heat treatment temperature is low. If the heat treatment temperature can exceed 450° C., then hot annealing is preferred. Particularly with processes performed close to a substrate, a post-processing is performed where heat near 700° C. is required. In this respect, an appropriate annealing temperature needs to be selected by considering the required heat resistance, etc.

In the present disclosure where conditions and/or structures are not specified, the skilled artisan in the art can readily provide such conditions and/or structures, in view of the present disclosure, as a matter of routine experimentation. Additionally, the conditions and/or structures disclosed in U.S. patent application Ser. No. 11/465,751 owned by the same assignee can be used in embodiments of the present invention.

EXAMPLE

Experiments were conducted as described below. The results are indicated in tables below. In these experiments, a plasma CVD device shown in FIG. 1 and FIG. 3 was used as an experimental device.

The diameter of a substrate was 200 mm. The thickness of each insulation film was set at 500 nm.

An insulation film was formed on and filled in an irregular surface of SiN formed on a Si wafer including a hole having a width of 60 nm and a depth of 600 nm. Annealing was conducted in a UV irradiation apparatus shown in FIG. 2 or in a furnace chamber shown in FIG. 4 made of a quartz tube provided with a quartz boat capable of performing annealing at a vacuum pressure to atmospheric pressure.

Film Formation

Conventional Example

A low-k film (siloxane film) was formed on a substrate under the conditions shown in Table 1 below.

TABLE 1

|  | Conventional Formation Conventional Formation |
| --- | --- |
| Triethoxysilane (sccm) | 10 |
| Hexane (sccm) | 150 |
| O2 (sccm) | 500 |
| He (sccm) | 630 |
| Pressure (Pa) | 266 |
| RF (13.56 MHz) power (W) | 100 |
| Susceptor temperature (° C.) | 0 |
| Gap between electrodes (mm) | 24 |
| Time (second) | 70 |

Examples 1-4

In each example, an inorganic silazane bulk film was first formed on a substrate under the conditions shown in Table 2 below, and then the bulk film was treated with CxHy gas under the conditions shown in Table 3.

TABLE 2

| | Silazane Bulk Formation | | | |
| --- | --- | --- | --- | --- |
| | Ex. 1 | Ex. 2 | Ex. 3 | Ex. 4 |
| SiH4 (sccm) | 10 | 100 | 50 | 100 |
| NH3 (sccm) | 50 | 25 | 50 | 25 |
| Ar (sccm) | 1000 | 1000 | 1000 | 1000 |
| Pressure (Pa) | 266 | 266 | 266 | 266 |
| RF (13.56 MHz) (W) | 100 | 100 | 100 | 100 |
| Susceptor Temp. (° C.) | 0 | 0 | 0 | 0 |
| Gap (mm) | 24 | 24 | 24 | 24 |
| Time (second) | 60 | 75 | 64 | 75 |

TABLE 3

CxHy Treatment

|  | Ex. 1 | Ex. 2 | Ex. 3 | Ex. 4 |
|---|---|---|---|---|
| Hexane (sccm) | 150 | 150 | 150 | 150 |
| Ar (sccm) | 630 | 630 | 630 | 630 |
| Pressure (Pa) | 266 | 266 | 266 | 1000 |
| RF (13.56 MHz) (W) | 200 | 200 | 200 | 200 |
| Susceptor Temp. (° C.) | 0 | 0 | 0 | 0 |
| Gap (mm) | 24 | 24 | 24 | 24 |
| Time (second) | 95 | 95 | 95 | 25 |

Examples 5-8

In each example, an inorganic silazane bulk film was formed on a substrate with CxHy gas under the conditions shown in Table 4 below.

TABLE 4

Liquid Layer Formation by SiH4 + NH3 + CxHy

|  | Ex. 5 | Ex. 6 | Ex. 7 | Ex. 8 |
|---|---|---|---|---|
| SiH4 (sccm) | 10 | 100 | 50 | 100 |
| NH3 (sccm) | 50 | 25 | 50 | 25 |
| CxHy (sccm) | Hexane 200 | Hexane 200 | Hexane 200 | Mesitlyene 150 |
| Ar (sccm) | 1000 | 1000 | 1000 | 1000 |
| Pressure (Pa) | 266 | 266 | 266 | 266 |
| RF (13.56 MHz) (W) | 100 | 100 | 100 | 100 |
| Susceptor Temp. (° C.) | 0 | 0 | 0 | 0 |
| Gap (mm) | 24 | 24 | 24 | 24 |
| Time (second) | 55 | 71 | 58 | 49 |

Heat-Treatment (Post Film Formation)

Heat-treatment was performed to each film formed on the substrate under the conditions shown in Table 5 below.

TABLE 5

Post Formation Treatment

| EX | Curing type | Substrate Temp. (° C.) | Duration (min) | Introduced gas | Gas flow (sccm) | Pressure (Pa) |
|---|---|---|---|---|---|---|
| Comp. | Thermal annealing | 800 | 60 | N2 | 1000 | Atmospheric |
| Ex. 1 | ↓ | ↓ | ↓ | O2 | 1000 | ↓ |
| Ex. 2 | ↓ | ↓ | ↓ | ↓ | ↓ | ↓ |
| Ex. 3 | ↓ | ↓ | ↓ | ↓ | ↓ | ↓ |
| Ex. 4 | UV curing | 400 | 30 | ↓ | ↓ | 1000 |
| Ex. 5 | Thermal annealing | 800 | 60 | ↓ | ↓ | Atmospheric |
| Ex. 6 | ↓ | ↓ | ↓ | ↓ | ↓ | ↓ |
| Ex. 7 | ↓ | ↓ | ↓ | ↓ | ↓ | ↓ |
| Ex. 8 | ↓ | ↓ | ↓ | ↓ | ↓ | ↓ |

Film Characteristics

Each thus-obtained film was evaluated and the results are shown in Table 6 below. A wet etch rate was evaluated using an undiluted liquid of LAL500 (manufactured by Stella-Chemifa in Japan) at room temperature. The presence or absence of voids in the filled film was confirmed by using a total reflection X-ray fluorescence (XRR).

TABLE 6

Film Characteristics

| EX | Thickness (nm) | Dielectric constant | Leak Current 2MV(A/cm2) | RI | Stress (MPa) | Film Density (g/cm3) | Blanket/Pattern W/R(nm/min) | Film Shrinkage (%) | Voids |
|---|---|---|---|---|---|---|---|---|---|
| Com | 500 | 3.93 | 3.5E-10 | 1.45 | -5 | 1.9 | 40/200 | 28 | Observed |
| 1 | ↓ | 3.92 | 1.0E-10 | 1.44 | -10 | 2.0 | 50/75 | 15 | None |
| 2 | ↓ | 3.95 | 1.5E-10 | 1.51 | 0 | 2.15 | 39/63 | 8 | ↓ |
| 3 | ↓ | 3.85 | 8.9E-11 | 1.47 | -20 | 2.1 | 41/69 | 10 | ↓ |
| 4 | ↓ | 3.88 | 9.6E-11 | 1.5 | 0 | 2.2 | 46/73 | 7 | ↓ |
| 5 | ↓ | 3.92 | 8.7E-11 | 1.44 | 10 | 2.05 | 50/95 | 14 | ↓ |
| 6 | ↓ | 3.95 | 7.0E-11 | 1.52 | 15 | 2.19 | 43/75 | 7 | ↓ |
| 7 | ↓ | 3.91 | 7.2E-11 | 1.47 | 10 | 2.17 | 45/80 | 11 | ↓ |
| 8 | ↓ | 3.95 | 6.9E-11 | 1.52 | 18 | 2.2 | 40/69 | 5 | ↓ |

As shown in Table 6, all of the oxide films derived from the inorganic silazane-based films exhibit excellent filling or padding property, good film density, and excellent anti-shrinkage property (Examples 1-8) especially when the flow of the Si-supplying gas was greater than that of the N-supplying gas (Examples 2-4 and 6-8). Further, both methods of using the CxHy gas worked to reduce fluidity of the silazane films for eliminating voids in the films (Examples 1-4 and 5-8).

Examples 9-11

Figure 5:
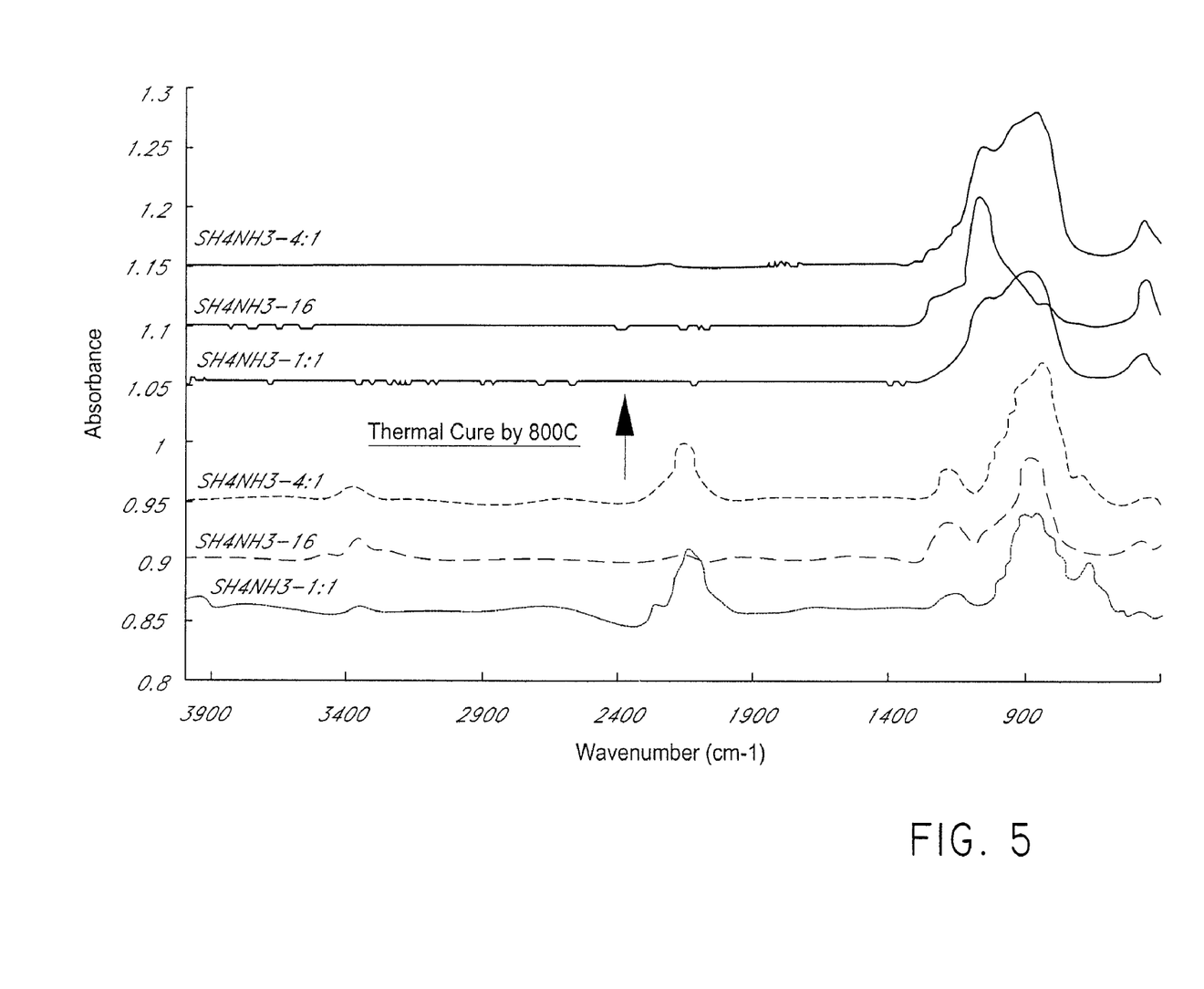
FIG. 5 is an FT-IR chart of thermally cured films without introducing oxygen in an embodiment of the present invention.

In Examples 9 to 11, a silazane bulk film was formed in the same manner as in Examples 1 to 3, and the obtained film was heat-treated at 800° C. in a normal atmosphere (without introducing any oxidizing gas) to examine how the film composition would change after the heat treatment using FT-IR. The results are shown in FIG. 5. These results indicate that nitrogen still remained in the film even after the heat treatment is given in a normal atmosphere, and therefore the achieved film was not a complete oxide film. If the N feed gas was rich (Example 9), Si—N bonds remained but many Si—O bonds were also created and therefore the film composition became close to that of an oxide film. This suggests that an environment where the N feed gas is rich is desirable when heat treatment is given in a normal atmosphere.

Figure 6:
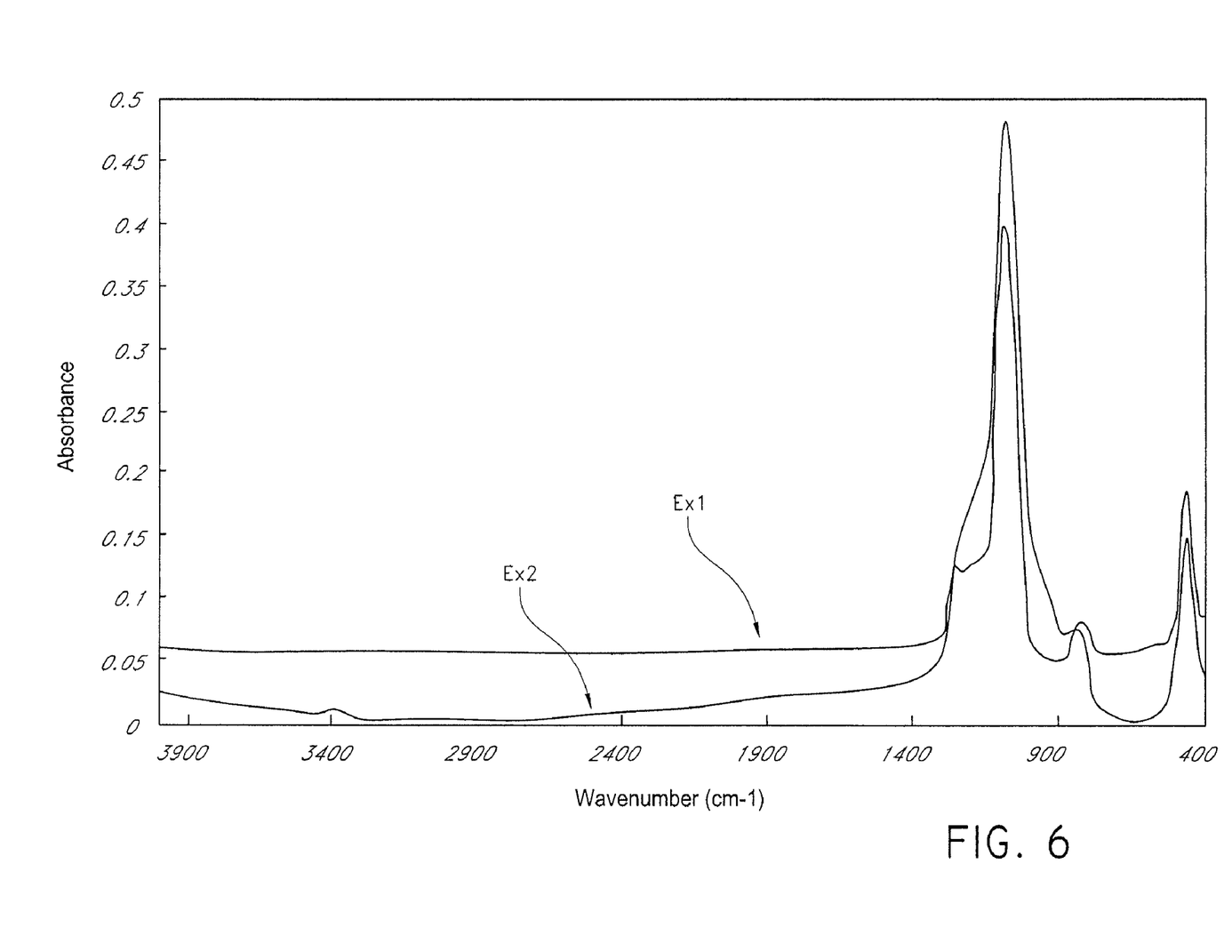
FIG. 6 is an FT-IR chart of thermally cured films with introducing oxygen in an embodiment of the present invention.

FIG. 6 is an FT-IR chart illustrating the compositions of oxide films obtained by Examples 1 and 2. To obtain an oxide film, an oxidizing gas needs to be introduced during annealing. Accordingly, Examples 1 and 2, where 1 SLM of oxygen was introduced and heat treatment was given at the same temperature used in Examples 9 to 11, resulted in favorable oxide films as indicated by the FT-IR peaks. It was also confirmed that the change of Si—N to Si—O would occur under $O_2$ curing using UV light of 172 to 260 nm in wavelength. For your information, the peak intensity and wavelength vary even when a same SiO film is formed. This is due to the different conditions used for forming a silazane bulk film.

The present invention includes the above mentioned embodiments and other various embodiments including the following:

1) A method for forming an insulation film by means of plasma CVD, wherein SixHy is combined with $NH_3$ or $N_2$ to form silazane with the susceptor temperature adjusted to a range of −50 to 50° C. As an option, a silazane film is formed using a liquid material of SiaNbCdHe (where a, b, d and e are arbitrary integers). For example, this liquid material may be 1,1,3,3 tetramethyldisilazane, hexamethylcyclotrisilazane, octamethylcyclotetrasilazane, or any mixture of the foregoing.

2) A method according to 1) above, wherein $O_2$, $CO_2$ or the like is introduced in the subsequent UV curing or hot annealing process to substitute the nitrogen groups in the film with oxygen groups to form a dense oxide film.

3) A method according to 2) above, wherein an appropriate type of annealing to be given to the formed film is selected in consideration of the heat history.

4) A method according to 1) above, wherein an additive gas containing at least $C\alpha H\beta O\gamma$ ($\alpha$ and $\beta$ are natural numbers of 1 or greater, while $\gamma$ is any natural number including 0) is introduced during, before or after the film forming process.

5) A method wherein an oxidizing gas is not introduced unlike in 2) above, if a silicon nitride film is to be formed after the heat treatment.

6) A method according to any one of 1) to 5) above, wherein plasma treatment is given before the film forming process to change the surface condition of the base film from hydrophobic to hydrophilic.

7) A method according to 1) above, wherein UV curing or hot annealing is given in an oxidizing gas atmosphere after the film forming process to form a thin oxide film.

8) A method according to 7) above, wherein the type of annealing to be given after the heat treatment is selected in consideration of the heat history so that, specifically, UV curing is used if the heat treatment temperature is low, or up to 450° C., and hot annealing is used if the heat treatment temperature is 450° C. or above.

9) A method according to 7) or 8) above, wherein a gas containing oxygen element is introduced after the film forming process to oxidize the deposited silazane.

10) A method according to any one of 1) to 9) above, wherein a silazane film offering good embedding characteristics is formed by using $SiH_4$, $Si_2H_6$ or other SixHy gas as a material gas, using $NH_3$, $N_2$ or other nitrogen additive alone or in combination as an additive gas, and also adding He, Ar or other inert element as an inert gas. If stress control is required, $H_2$ may be added to increase the oxygen content when a liquid layer is formed so that stress control becomes possible.

11) A method according to any one of 1) to 10) above, wherein the flow rate of the material is in a range of 1 to 350 sccm.

12) A method according to any one of 1) to 11) above, wherein the flow rate of the nitrogen additive is in a range of 10 to 700 sccm and over double amount of the material.

13) A method according to any one of 1) to 12) above, wherein a film is formed by means of plasma and the frequency to oscillate plasma is in a range of 13.56 to 60 MHz.

14) A method according to any one of 1) to 13) above, wherein a substrate is set on a ceramic susceptor structured to allow a cooling medium to flow inside the ceramics, and silazane is deposited on said substrate.

15) A method according to any one of 1) to 14) above, wherein the outer periphery of the substrate placed on the susceptor is covered with an anti-deposition mask by 3 to 0.1 mm to prevent silazane from depositing on the wafer bevel.

16) A method according to any one of 1) to 15) above, wherein the laminated structure of silazane and siloxane is annealed to form a film on the substrate.

17) A method according to 16) above, wherein silazane is deposited and annealed, while siloxane is also deposited and annealed, to form a film on the substrate.

18) A method according to 10) above, wherein the flow rate of the inert gas is in a range of 20 to 3,000 sccm.

19) A method according to any one of 1) to 18) above, wherein $H_2$ gas is added if the amount of hydrogen to be absorbed when a liquid layer is formed needs to be increased to enable stress control or for any other reason. In this case, the flow rate is in a range of 10 to 2,000 sccm.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of forming a dielectric film, comprising:
   introducing a gas consisting of Si, H, and N or consisting of Si H, N, and C into a reaction chamber where an object is placed;

controlling a temperature of the object at −50° C. to 50° C.; and depositing by plasma reaction an inorganic silazane-based film constituted by Si, N, and H containing inorganic silazane bonds, said method further comprising introducing into the reaction chamber an additive gas consisting of C and H or consisting of C, H, and O continuously before, simultaneously with, or continuously after the deposition of the inorganic silazane-based film on the object.

2. The method according to claim 1, wherein the additive gas is hexane or mesitylene.

3. The method according to claim 1, wherein the object is a semiconductor substrate placed on a susceptor disposed in the reaction chamber.

4. The method according to claim 3, further comprising heat-treating the substrate with the inorganic silazane-based film in a heat-treating chamber without introducing an oxygen-supplying gas into the heat-treating chamber, thereby forming a silicone nitride film from the film.

5. The method according to claim 4, wherein the substrate has an irregular surface including a concave portion.

6. The method according to claim 5, wherein the concave portion of the irregular surface has holes or grooves, and the deposition step is performed on the irregular surface to fill the holes or grooves with the inorganic silazane-based film.

7. The method according to claim 5, further comprising heat-treating the substrate with the inorganic silazane-based film in a heat-treating chamber while introducing an oxygen-supplying gas into the heat-treating chamber to replace N with O in the film, thereby converting the film to an oxide film.

8. The method according to claim 7, wherein the oxygen-supplying gas is O2, CO2, and/or N2O.

9. The method according to claim 7, wherein the heat-treatment step is performed by UV curing.

10. The method according to claim 7, wherein the heat-treatment step is performed by thermal annealing at a temperature of 450° C. or higher.

11. A method for forming an interconnect structure, comprising the steps of:

forming a three-dimensional structure for interconnect in a substrate; and forming an insulation layer on a surface of the three-dimensional structure using a method comprising:

introducing a gas consisting of Si, H, and N or consisting of Si H, N, and C into a reaction chamber where an object is placed, wherein in the gas introducing step, no oxygen-supplying gas is introduced into the reaction chamber;

controlling a temperature of the object at −50° C. to 50° C.; and depositing by plasma reaction an inorganic silazane-based film constituted by Si, N, and H containing inorganic silazane bonds.

12. The method according to claim 11, further comprising wet-etching the insulation film.

13. The method according to claim 12, wherein the step of forming a three-dimensional structure comprises forming a layer of aluminum, tungsten, or tungsten silicon as a wiring layer and etching the layer in a pattern.

14. A method of forming a dielectric film, comprising the steps of:

introducing a gas constituted by Si H, N and optionally C into a reaction chamber where an object is placed;

controlling a temperature of the object at −50° C. to 50° C.;

depositing by plasma reaction an inorganic silazane-based film constituted by Si, N, and H containing inorganic silazane bonds; and adding fluidity to the inorganic silazane-based film so as to be flowable on the object, by using a hydrocarbon gas.

* * * * *

UNITED STATES PATENT AND TRADEMARK OFFICE
CERTIFICATE OF CORRECTION

PATENT NO. : 7,781,352 B2
APPLICATION NO. : 11/759159
DATED : August 24, 2010
INVENTOR(S) : Atsuki Fukazawa et al.

It is certified that error appears in the above-identified patent and that said Letters Patent is hereby corrected as shown below:

Title Page 2, Column 2, Line 4, under other publications, change "silicion" to --silicon--.

Title Page 2, Column 2, Line 8, under other publication, change "depoisted" to --deposited--.

In Column 12, Line 33 (Approx.), below "TABLE 1" delete "Conventional Formation". (Second Occurrence)

In Column 14, Line 8, below "25" change "Mesitlyene" to --Mesitylene--.

In Column 16, Line 66, in Claim 1, change "Si H," to --Si, H,--.

In Column 17, Line 21, in Claim 5, change "claim 4," to --claim 3,--.

In Column 18, Line 11, in Claim 11, change "Si H," to --Si, H,--.

In Column 18, Line 28, in Claim 14, change "Si H," to --Si, H,--.

Signed and Sealed this
Fifteenth Day of November, 2011

David J. Kappos
*Director of the United States Patent and Trademark Office*